(12) United States Patent
Tsukagoshi

(10) Patent No.: US 10,340,397 B2
(45) Date of Patent: Jul. 2, 2019

(54) OPTICAL SENSOR DEVICE

(71) Applicant: SII Semiconductor Corporation, Chiba (JP)

(72) Inventor: Koji Tsukagoshi, Chiba (JP)

(73) Assignee: ABLIC Inc. (JP)

( * ) Notice: Subject to any disclaimer, the term of this patent is extended or adjusted under 35 U.S.C. 154(b) by 19 days.

(21) Appl. No.: 15/602,392

(22) Filed: May 23, 2017

(65) Prior Publication Data

US 2017/0256658 A1 Sep. 7, 2017

Related U.S. Application Data

(60) Continuation of application No. 15/059,674, filed on Mar. 3, 2016, now Pat. No. 9,997,645, which is a
(Continued)

(30) Foreign Application Priority Data

Feb. 4, 2014 (JP) ................................. 2014-019736
Dec. 5, 2014 (JP) ................................. 2014-247062

(51) Int. Cl.
*H01L 23/31* (2006.01)
*H01L 23/498* (2006.01)
(Continued)

(52) U.S. Cl.
CPC ...... *H01L 31/0203* (2013.01); *H01L 23/3157* (2013.01); *H01L 23/49838* (2013.01);
(Continued)

(58) Field of Classification Search
CPC .................................................. H01L 23/3157
See application file for complete search history.

(56) References Cited

U.S. PATENT DOCUMENTS 4,769,344 A * 9/1988 Sakai ..................... G11C 16/18
174/529
5,122,858 A 6/1992 Mahulikar et al. ............. 357/70
(Continued)

FOREIGN PATENT DOCUMENTS

JP 59219948 12/1984
JP 5291426 11/1993
JP 2007059536 3/2007

OTHER PUBLICATIONS

Patent Abstracts of Japan, Publication No. 04-157759, Publication Date May 29, 1992.
Patent Abstracts of Japan, Publication No. 2002-198455, Publication Date Jul. 12, 2002.

*Primary Examiner* — William A Harriston
(74) *Attorney, Agent, or Firm* — Adams & Wilks

(57) ABSTRACT

A package for an optical sensor device has a double-molded structure in which a first resin molded portion and a second resin molded portion are integrated. The first resin molded portion has a structure in which peripheries of a die pad portion on which an optical sensor element is mounted and a part of leads are molded with a resin so as to be integrated. The second resin molded portion has a structure in which the periphery of the first resin molded portion is molded with a resin so as to form an outer shape of the package. A glass substrate having a filter function is bonded to an upper surface of the resin molded portions to form a cavity in which is mounted the optical sensor element.

11 Claims, 7 Drawing Sheets

Related U.S. Application Data division of application No. 14/603,500, filed on Jan. 23, 2015, now abandoned.

(51) Int. Cl.
*H01L 31/02* (2006.01)
*H01L 31/0203* (2014.01)
*H01L 31/0216* (2014.01)
*H01L 31/0232* (2014.01)

(52) U.S. Cl.
CPC .. *H01L 31/02002* (2013.01); *H01L 31/02162* (2013.01); *H01L 31/02325* (2013.01); *H01L 2224/48091* (2013.01); *H01L 2224/48247* (2013.01); *H01L 2224/73265* (2013.01); *H01L 2924/181* (2013.01)

(56) References Cited

U.S. PATENT DOCUMENTS

| | | | |
|---|---|---|---|
| 5,200,367 A | 4/1993 | Ko | 437/216 |
| 5,523,608 A * | 6/1996 | Kitaoka | H01L 25/16 |
| | | | 257/433 |
| 5,619,065 A | 4/1997 | Kim | 257/673 |
| 5,946,556 A * | 8/1999 | Hashizume | H01L 21/56 |
| | | | 257/E21.502 |
| 6,680,525 B1 * | 1/2004 | Hsieh | H01L 27/14618 |
| | | | 257/678 |
| 6,849,915 B1 | 2/2005 | Tsai | 257/432 |
| 2004/0113221 A1 | 6/2004 | Hsieh | 257/433 |
| 2009/0057799 A1 * | 3/2009 | Chan | H01L 31/0203 |
| | | | 257/433 |
| 2011/0210354 A1 | 9/2011 | Ichikawa | 257/98 |
| 2012/0013333 A1 | 1/2012 | Ararao et al. | 324/244 |
| 2013/0134454 A1 | 5/2013 | Chan | 257/88 |

* cited by examiner

OPTICAL SENSOR DEVICE

BACKGROUND OF THE INVENTION

1. Field of the Invention

The present invention relates to an optical sensor device. More specifically, the present invention relates to a package structure of the optical sensor device.

2. Description of the Related Art

FIG. 11 is a sectional view illustrating an example of a related-art package (FIG. 2 of Japanese Patent Application Laid-open No. 2002-198455). This package has the following structure. A package body 21 includes a lead 25 and a cavity formed by a bottomed portion 23 and an inner side surface 24 that are made of a resin material. A semiconductor element 22 is mounted on the bottomed portion 23 of the package body 21, and a lid 27 is provided on a package upper surface. A surface of a part of the lead 25 is exposed from the bottomed portion 23, and another part of the lead 25 is exposed to outside through the package formed of a resin molded portion so as to be used as an external terminal. An electrode is formed on a surface of the element 22. The electrode formed on the surface of the element 22 and the lead 25 exposed from the bottomed portion 23 of the cavity are electrically connected to each other through a wire 26. For example, in the case of a light-receiving sensor device having a light-receiving element mounted thereon, the light-receiving element receives light from an external light source, including natural light. Alternatively, light from a light-emitting device is radiated to an object and the light-receiving element receives light reflected from the object. Thus, a generated electromotive force can be transmitted from the electrode formed on the surface of the element to outside through the lead 25 via the wire 26.

Further, FIG. 12 is a sectional view illustrating another example of a related-art package (FIG. 1 of Japanese Patent Application Laid-open No. Hei 04-157759). This package has the following structure. An optical semiconductor element 22 and a wire 26 mounted on a die pad 27 and a lead 25 forming a die pad and a lead are sealed with a transparent mold resin 28 formed of an epoxy resin, and a transparent plate member 29 made of glass or plastic is arranged on a surface of the transparent mold resin 28 in a direction immediately above the optical semiconductor element 22. An upper surface of the optical semiconductor element 22 serves as a light-receiving surface 22a, and an electrode formed on the upper surface and a part of the lead 25 sealed with the transparent mold resin 28 are electrically connected to each other through the wire 26. The lead 25 is exposed to outside through the transparent mold resin 28 so as to be used as an external lead. In the case where the optical semiconductor element 22 is used as, for example, a light-receiving sensor device having a light-receiving element mounted thereon, light from outside passes through the transparent plate member 29 and through the transparent mold resin 28 to be received by the light-receiving surface 22a of the optical semiconductor element 22. Thus, a generated electromotive force can be transmitted from the electrode formed on the surface of the element to outside through the lead 25 via the wire 26.

However, in the package structure described in Japanese Patent Application Laid-open No. 2002-198455, the lead 25 is held only with the resin of the package body 21 forming the cavity. Specifically, a portion of the lead 25, excluding a part serving as the external terminal exposed to outside through the resin forming the cavity and a wire bonding portion exposed from the surface of the bottomed portion 23 of the cavity, is held only with the resin so as to be in close contact therewith. In this structure, there are the following problems: the removal preventing force of the lead is low; the holding area thereof is small; and the lead surface made of a metal has low adhesion to the resin. Further, in the case where the part of the lead 25 serving as the external lead terminal is bent and cut, mechanical stress is concentrated on a root portion between the molding resin and the lead 25 exposed to outside from the molding resin, so that the resin is liable to be peeled and cracked. Further, a gap remains at an interface between the lead 25 and the resin, with the result that the package has low airtightness. Therefore, it is difficult to obtain a strong holding force of the lead 25. Further, there is also a problem in that water is liable to enter the package from outside, and in addition, ambient environment may change. Thus, it becomes more difficult to obtain high reliability.

Further, in the package structure described in Japanese Patent Application Laid-open No. Hei 04-157759, the entire peripheries of the optical semiconductor element 22, the wire 26, the die pad 27, and the lead 25 are sealed with the transparent mold resin 28, with the result that the contact area between the lead 25 and the transparent mold resin 28 is increased, and the holding force of the lead 25 can also be increased. However, even in the structure in which the periphery of the lead 25 is sealed with the transparent mold resin 28 formed of an epoxy resin, the adhesion between the metal and the resin is not sufficient, and there is a significant difference in expansion coefficient between the metal and the resin. Thus, it cannot be considered that the adhesion between the die pad 27 and lead 25 and the transparent mold resin 28 is sufficient, and a gap remains therebetween, which degrades airtightness. Further, in the case where the external lead is bent and cut in the structure in which the lead 25 is sealed with the transparent mold resin 28 formed of an epoxy resin, stress is concentrated on the transparent mold resin 28. Therefore, the transparent mold resin 28 is liable to be cracked and chipped, and further, a gap is liable to be formed between the transparent mold resin 28 and the lead 25. In addition, there is a risk in that an external appearance of the package may be impaired. Therefore, there is a demand for means for enhancing the adhesion between the lead and the resin, achieving strong resistance to stress during processing, and increasing the holding force of the lead.

SUMMARY OF THE INVENTION

It is an object of the present invention to provide an optical sensor device having a strong holding force of a lead even in the case where a semiconductor package is miniaturized and the number of lead terminals is increased.

An optical sensor device according to one embodiment of the present invention includes an optical sensor device package having a package structure with a cavity. The package structure includes a glass substrate having a filter function, a first resin molded portion in which the entire peripheries of an inner lead and a die pad are subjected to contact fitting molding through use of a resin so as to be integrated, and a second resin molded portion in which the first resin molded portion is arranged on a bottom surface of a bottom portion of the cavity and the periphery excluding a portion of the first resin molded portion exposed from the bottom portion is subjected to contact fitting molding so as to form the cavity and an outer shape design of the package. An optical sensor element is bonded and fixed to a center of the bottomed portion of the resin molded package having the cavity through use of an adhesive, and the glass substrate having a filter function and an upper surface of the resin molded package having the cavity are bonded and fixed to each other through use of an adhesive.

Further, in the package, as the first resin molded portion, a molded region is used, in which the periphery of an inner lead serving as a metallized wire bonding portion made of a metal exposed from the bottomed portion of the cavity and the periphery of a die pad portion to which the optical sensor element is to be bonded and fixed are integrated by resin molding.

Further, as the second resin molded portion, a molded region is used, which is subjected to contact fitting molding with the first resin molded portion and which forms the cavity and the entire package by resin molding, with the first resin molded portion being arranged on the bottom surface of the bottomed portion of the cavity.

Further, as the glass substrate having a filter function, a glass substrate having visibility characteristics or characteristics of blocking ultraviolet light or infrared light is used.

Further, the glass substrate having a filter function and the upper surface of the package having the cavity, which is molded with the resin, are bonded and fixed to each other through use of an adhesive.

Further, as the resin to be used for the first resin molded portion, a non-transparent resin or a resin having a light-blocking property is used. As the resin to be used for the second resin molded portion, a non-transparent resin, a resin having a light-blocking property, or a resin having reflectivity is used.

Further, in a structure in which the die pad portion is made of the same metal as that forming the lead, a suspension lead for connecting the die pad portion to an outer periphery of a frame is cut off after the peripheries of the lead and the die pad portion are molded with the first resin molded portion so that the second resin molded portion covers a cut surface of the suspension lead of the die pad portion by molding.

The optical sensor device according to one embodiment of the present invention can have a hollow structure in which the optical sensor element is sealed. In addition, the peripheries of the lead having the wire bonding portion exposed and the die pad are subjected to contact fitting molding with the first resin molded portion integrated by resin molding, and the periphery of the first resin molded portion, in which the wire bonding portion and the die pad surface are arranged on the bottomed portion, is subjected to contact fitting molding with the second resin molded portion so as to form the integrated package structure having the cavity. Thus, in a structure in which the periphery of the optical sensor element is molded with a resin, stress applied to the optical sensor element is removed. Moreover, the interface between the die pad and lead and the resin is allowed to have high adhesion and high airtightness, and contact fitting with a strong holding force of the lead can be achieved.

Further, the lead is bent and cut so as to also serve as the external lead terminal. The first resin molded portion and the second resin molded portion hold the lead. Therefore, at least mechanical stress applied to the lead can be received and alleviated by the second resin molded portion. In addition, the lead held even by the first resin molded portion is less liable to receive stress, and water and the like can be prevented from entering the package. Therefore, even in a package having a risk in that the factor for degrading reliability may be increased due to the increase in number of lead terminals, based on the fact that the mechanical stress and the entrance path of the water and the like increase in proportional to the number of the external lead terminals, an optical sensor device excellent in stability of characteristics and reliability can be provided.

DETAILED DESCRIPTION OF THE PREFERRED EMBODIMENTS

Figure 1:
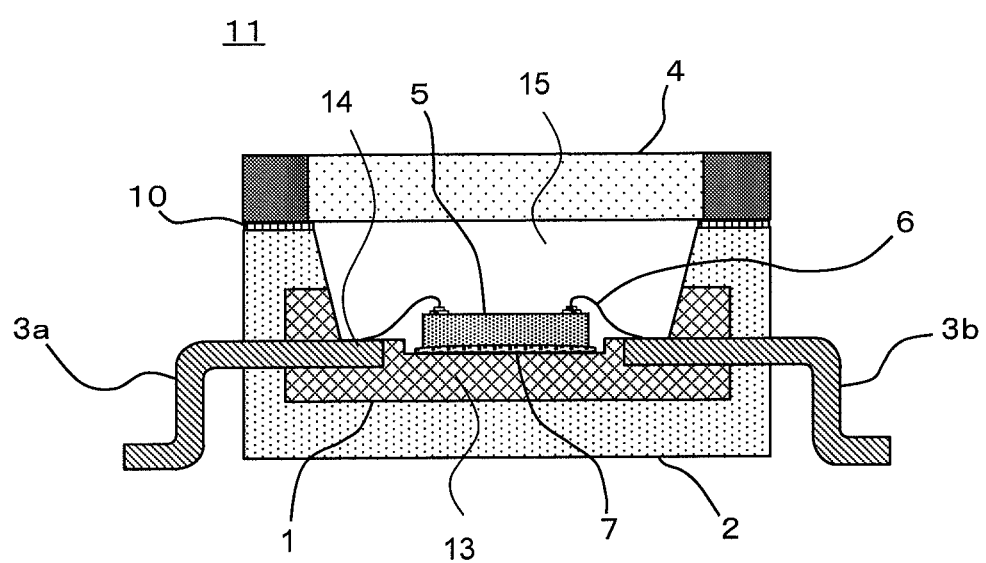
FIG. 1 is a sectional view schematically illustrating a configuration of an optical sensor device according to one embodiment of the present invention.

An optical sensor device according to one embodiment of the present invention includes a glass substrate having a filter function, a resin molded portion having a cavity, a lead integrated by resin molding, and an optical sensor element mounted on a die pad portion provided on a bottomed portion of the cavity so as to be electrically connected to the lead. The optical sensor device has a hollow structure in which the optical sensor element is fixed so as to be surrounded by the glass substrate having a filter function and the resin molded portion having the cavity. The resin molded portion having the cavity forms a package having a double molding structure in which a first resin molded portion and a second resin molded portion are subjected to contact fitting molding. In the first resin molded portion, the periphery of the die pad portion and the periphery of a part of the lead in which a wire bonding portion is exposed are subjected to resin molding so as to be integrated. In the second resin molded portion, the periphery of the first resin molded portion arranged on the bottomed portion of the cavity is molded with a resin so as to form an outer shape of the package.

The resin molded portion having the cavity includes the first resin molded portion in which the periphery of the die pad portion and the periphery of the part of the lead in which the wire bonding portion is exposed are subjected to contact fitting molding through use of a resin so as to be integrated, and the second resin molded portion in which the periphery of the first resin molded portion arranged on the bottomed portion of the cavity is subjected to contact fitting molding through use of a resin so as to form the outer shape of the package having the cavity. The optical sensor element to be mounted on the die pad portion on the bottomed portion of the cavity and the wire bonding portion, which is one end of the lead exposed to the bottomed portion, are electrically connected to each other. The other end of the lead is exposed to outside through the first resin molded portion and the second resin molded portion so as to be used as an external lead terminal.

The resin molded portion having the cavity is made of a non-transparent resin or a resin having light-blocking property, or a resin having reflectivity, and the resin is formed of a thermoplastic resin or a thermosetting resin. The glass substrate having a filter function and the resin molded portion having the cavity are fixed and bonded to each other by adhesion fitting.

Further, the resin molded portion having the cavity is formed of an area having an element mounting portion formed on the bottomed portion by resin molding and an area having the die pad portion made of a metal.

In a structure in which the die pad portion is made of the same metal as that forming the lead, a suspension lead for connecting the die pad portion to a frame is cut off after the first resin molded portion is molded, and contact fitting molding is performed with the second resin molded portion, with the result that a package structure in which a cut surface of the suspension lead is not exposed is configured.

In the resins that form the resin molded portion, a resin having a glass transition temperature and a heat distortion temperature that are substantially identical with or higher than those of the resin to be used for the second resin molded portion is used for the first resin molded portion.

The first resin molded portion has a configuration in which a part thereof is exposed to the cavity and the periphery thereof is subjected to contact fitting molding with the second resin molded portion. Alternatively, the first resin molded portion has a configuration in which the periphery thereof is subjected to contact fitting molding while being accommodated in the second resin molded portion so as to be entirely covered therewith.

The glass substrate having a filter function is made of glass having a function of blocking light having a specified wavelength. Alternatively, the glass substrate having a filter function is made of transparent glass having a multi-layer film of a metal oxide film formed thereon. Still alternatively, the glass substrate having a filter function is made of transparent glass having a dye or a pigment, which has a filter function, applied or bonded thereto.

First Embodiment

Now, a configuration of an optical sensor device according to a first embodiment of the present invention is described with reference to the drawings.

FIG. 1 is a schematic vertical sectional view of an optical sensor device 11 according to this embodiment. A resin molded portion having a cavity 15 is formed of a double molding structure in which a first resin molded portion 1 and a second resin molded portion 2 are subjected to contact fitting molding. The first resin molded portion 1 has a structure in which a part of leads 3a and 3b made of metals is subjected to contact fitting molding through use of a resin, and an element mounting portion 13 is integrally molded on a bottomed portion of the cavity 15. The peripheries of the leads 3a and 3b, excluding a wire bonding portion 14 and a portion exposed to outside through a package as an external lead terminal, are molded with the first resin molded portion 1. The periphery of the first resin molded portion 1 is subjected to contact fitting with the second resin molded portion 2 to form the package structure having the cavity 15. The first resin molded portion 1 forms the bottom portion and a part of an inner side surface of the cavity 15, and the second resin molded portion 2 forms the remaining inner side surface continuously from the first resin molded portion 1. The second resin molded portion 2 is molded so as to have a structure in which a part including the element mounting portion 13 and a portion serving as the wire bonding portion 14 is exposed, to thereby form the package having the cavity 15. An optical sensor element 5 is bonded onto the element mounting portion 13 with an adhesive 7 so as to be mounted thereon. The optical sensor element 5 and the wire bonding portion 14 provided on the leads 3a and 3b are electrically connected to each other through a wire 6, and a part of the leads 3a and 3b exposed to outside of the package through the resin molded portion serves as the external lead terminal. The optical sensor device 11 has a hollow structure in which a glass substrate 4 having a filter function is fixed and bonded to an upper surface of the resin molded portion having the cavity with an adhesive 10.

Due to a double molding structure in which the peripheries of the element mounting portion 13 and the wire bonding portion 14 of the leads 3a and 3b are integrated by resin molding, and a part of the leads 3a and 3b excluding a portion to be used as the external lead terminal and the first resin molded portion 1 are subjected to contact fitting molding with the second resin molded portion 2, the package can have enhanced adhesion between the leads 3a and 3b and the resin and enhanced airtightness at an interface therebetween. In addition, the second resin molded portion 2 can receive and alleviate stress, which concentrates on a root portion between the resin and the external lead terminal to cause peeling and cracking of the resin along lead bending, cutting, and the like, and at least the first resin molded portion 1 can maintain a state immediately after the molding. Therefore, the package is allowed to have high airtightness that makes it difficult for water, gas, dust, and the like to enter the package from outside, and there is also an effect for increasing the removal preventing force of the leads 3a and 3b. The double molding structure in the package of this embodiment aims at achieving the effect as a highly reliable package structure, and hence the use of the double molding structure is not particularly limited to an optical sensor device.

In this case, portions of the leads 3a and 3b, which are to be subjected to contact fitting with the first resin molded portion 1, are subjected to processing for enhancing the contact fitting force with respect to the resin, such as roughening, grooving, and crushing, or are provided with a structure for enhancing the contact fitting force with respect to the resin. Further, it is possible to provide portions of the leads 3a and 3b, which are to be subjected to contact fitting with the second resin molded portion 2, with a lead that is subjected to roughing, grooving, and crushing, and with a lead that is not subjected to such processing. Peeling and cracking of the resin can be prevented with strong adhesion strength in the lead that is subjected to roughing, grooving, and crushing, in the case where the stress caused by bending, cutting, and the like of the external lead terminal concentrates on the root portion between the external lead terminal and the second resin molded portion 2. Alternatively, by allowing separation of the lead from the resin with respect to generated stress, without performing roughing, bending, grooving, and crushing, so as to create a state of alleviating and dodging the stress, peeling and cracking of the resin can also be prevented. Further, in order to increase the contact fitting force between the resins in the case of molding the second resin molded portion, respective portions of an outer peripheral surface of the first resin molded portion 1, which are to serve as a side surface, a bottom surface, and an upper surface, may be provided with an uneven long groove, a protrusion, or the like (not shown). Thus, in the first resin molded portion 1, the second resin molded portion 2, and the leads 3a, 3b, high airtightness can be achieved at an interface between the leads 3a and 3b and the resin, and in addition, the removal preventing force of the leads 3a and 3b can be increased due to the high holding force of the leads 3a and 3b. Further, peeling and cracking of the resin is less liable to occur with respect to stress caused during processing of the external lead terminal and thermal stress caused during joining with a solder in the case of mounting on a mounting substrate, and thus an effect of high reliability can be obtained.

Further, the glass substrate 4 having a filter function is made of glass having visibility characteristics or glass having a structure in which glass having light-blocking property is formed on the periphery of glass having visibility characteristics. Alternatively, the glass substrate 4 is made of glass having a structure in which a multi-layer film of a metal oxide film or the like is formed on transparent glass not having specified optical characteristics. Still alternatively, the glass substrate 4 is made of glass having a structure in which a film formed of an organic substance having visibility characteristics is bonded to transparent glass not having specified optical characteristics. Further still alternatively, the glass substrate 4 is made of glass having a structure in which glass having characteristics of not transmitting light in a short wavelength range and glass having characteristics of not transmitting light in an infrared wavelength range are laminated with each other. Thus, an effect that the glass substrate 4 has both a stable filter function and high reliability can be obtained.

Further, as the resin to be used for the first resin molded portion 1, a resin is used, which has heat resistance equal to or higher than that of the resin to be used for the second resin molded portion 2. As the characteristics exhibiting heat resistance, the glass transition temperature and heat distortion temperature are used as guidelines. Thus, in the case of molding the second resin molded portion 2, the first resin molded portion 1 can be prevented from being softened or expanded due to the molding temperature. Further, in the case where heat is transmitted from outside to the package, the second resin molded portion 2 provided on an outer side is exposed to high temperature as compared to the first resin molded portion 1 due to the ambient temperature and the heat reaching the package through the external lead terminal, and hence damages to the first resin molded portion 1 having the optical sensor element 5 mounted thereon can be reduced.

Further, the resin generally expands due to high temperature. However, when the first resin molded portion 1 is made of a resin having heat resistance equal to or higher than that of the resin to be used for the second resin molded portion 2 and having a thermal expansion coefficient smaller than that of the resin to be used for the second resin molded portion 2, the resin to be used for the second resin molded portion 2 expands earlier than the resin to be used for the first resin molded portion 1. Thus, the periphery of the first resin molded portion 1 and the peripheries of the leads 3a and 3b subjected to contact fitting molding with the second resin molded portion 2 are compressed with the resin of the second resin molded portion 2, and hence a gap between the resin and the leads 3a and 3b can be closed at high temperature. Therefore, it is possible to achieve a structure and state in which water, dust, and the like are less liable to enter the package through the interface between the resin and the leads 3a and 3b, and hence an effect for reducing the risk in that water and the like may reach the optical sensor element 5 can be obtained.

Further, it is preferred that the resin to be used for the first resin molded portion 1 be formed of a thermoplastic resin or thermosetting resin having light-blocking property, and that the resin to be used for the second resin molded portion 2 be formed of a thermoplastic resin or thermosetting resin having light-blocking property, or a thermoplastic resin or thermosetting resin having reflectivity. Thus, the second resin molded portion 2 can block or reflect light from outside, with the result that light from the side surface or the back surface of the package is prevented from passing through the resin so as to enter the optical sensor element 5 mounted in the cavity. Further, due to the first resin molded portion 1 having light-blocking property, of the light that passes through the glass substrate 4 having a filter function to enter the cavity, light that enters portions other than a light-receiving portion provided on an upper surface of the optical sensor element 5 can be absorbed, and thus, incident light is prevented from being repeatedly reflected in the cavity. Accordingly, even in the case where incident light that enters the optical sensor element 5 is reflected in the cavity to be received by the optical sensor element 5 again, which occurs in a filter glass substrate having a structure in which a multi-layer film of a metal oxide film or the like is formed on transparent glass, a filter glass substrate having a structure in which a filter formed of an organic substance is bonded to transparent glass, and the like, and where light in an unnecessary wavelength band caused by angle dependency, in which the function of blocking light having a specified wavelength is degraded due to an increase in incident angle, enters the optical sensor element 5, an effect that the optical sensor element 5 has light-receiving sensitivity with angle dependency suppressed can be expected.

Second Embodiment

Figure 2A:
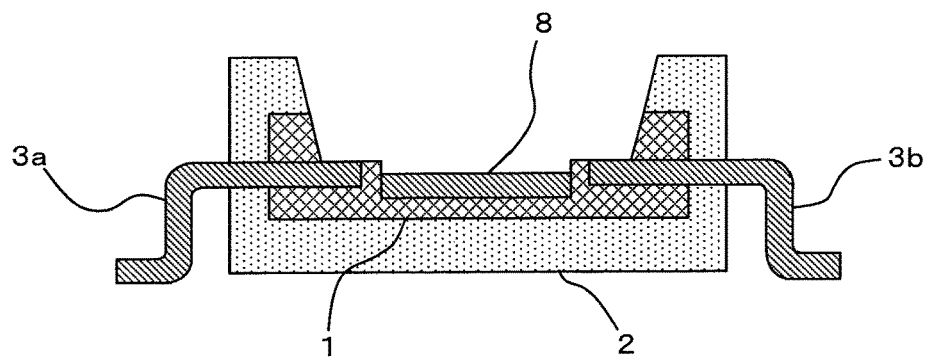
FIGS. 2A to 2C are sectional views and a front view schematically illustrating a configuration of an optical sensor device according to a second embodiment of the present invention.
Figure 2B:
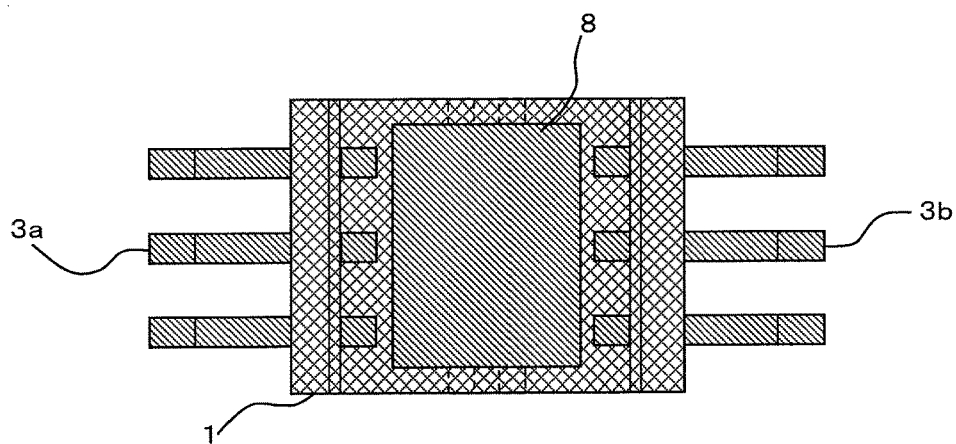
Figure 2C:
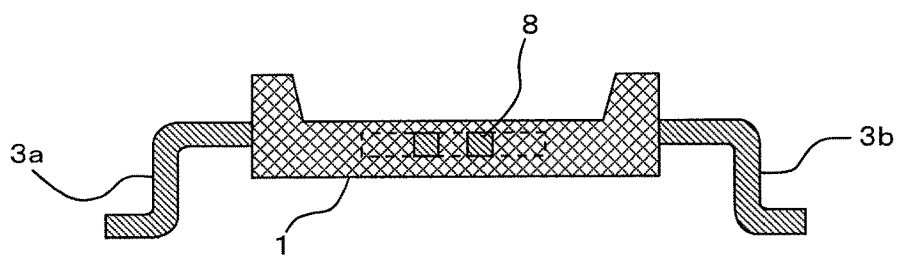

FIG. 2A is a sectional view of an optical sensor device 11 according to a second embodiment of the present invention. FIG. 2B is a front view of a first resin molded portion 1, and FIG. 2C is a sectional view thereof. FIG. 2A illustrates a cross section of a package body having a cavity, excluding a glass substrate 4 having a filter function, in the optical sensor device 11. The optical sensor device 11 has a structure in which a die pad portion 8 formed of a metal frame is provided on the first resin molded portion 1. The first resin molded portion 1 has a structure in which the periphery of the die pad portion 8 formed of a metal frame, excluding a surface side on which an optical sensor element 5 is to be mounted, and the periphery of each lead, excluding a portion in which a frame surface to be used as a wire bonding portion is exposed, are molded with a resin so as to be integrated.

Further, FIG. 2B illustrates a front view of the first resin molded portion 1 having an integrated structure after being molded, and FIG. 2C illustrates a sectional view thereof after being molded. The die pad portion 8 formed of a metal frame generally has a state in which a part of the periphery thereof is connected to a suspension lead. In the die pad portion 8 immediately after the first resin molded portion 1 is molded, a part of the periphery is still connected to the suspension lead so that the periphery is held by the first resin molded portion 1. After the suspension lead is cut off, a cut surface of the suspension lead is exposed from the first resin molded portion 1. The periphery of the first resin molded portion 1 in which the cut surface of the suspension lead is exposed is subjected to contact fitting molding with a second resin molded portion 2, with the result that a package is obtained in which the cut surface of the suspension lead is not exposed to the resin molded surface. Therefore, even when the package has a structure in which the die pad portion 8 on which the optical sensor element 5 is to be mounted is formed of a metal frame having the suspension lead, the cut surface of the suspension lead is not exposed from the resin molded surface, and there is no interface between the resin and the lead on the die pad portion 8 on which the optical sensor element 5 is to be mounted. Thus, an optical sensor device having high airtightness can be obtained in which the die pad portion 8 is formed as an element mounting portion having high airtightness without an entrance path for water and the like, and the leads 3*a* and 3*b* and the die pad portion 8 are strongly held and molded with the resin so as to have high adhesion.

Third Embodiment

Figure 3:
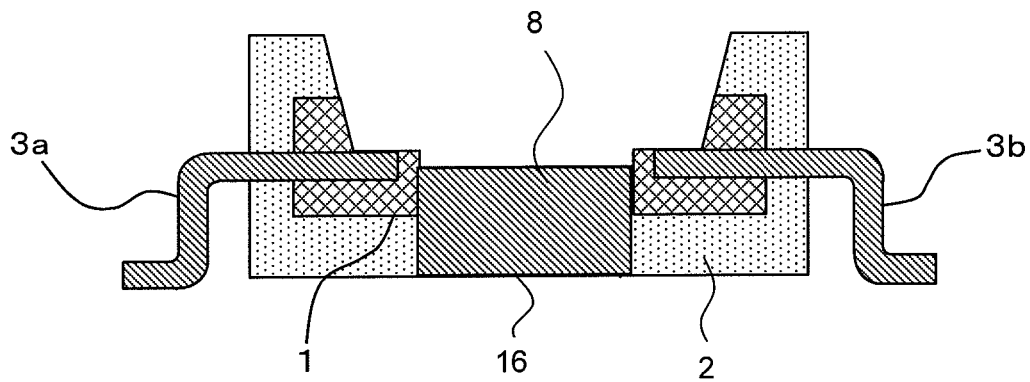
FIG. 3 is a sectional view schematically illustrating a configuration of an optical sensor device according to a third embodiment of the present invention.

FIG. 3 is a sectional view of an optical sensor device 11 according to a third embodiment of the present invention. In a first resin molded portion 1, a part of a die pad portion 8 formed of a metal frame on which an optical sensor element 5 is to be mounted is molded so as to increase thickness, and a bottom surface of the die pad portion 8 on which the optical sensor element 5 is to be mounted is exposed from a surface of a second resin molded portion 2 corresponding to a back surface of a package. The bottom surface of the die pad portion 8 is not covered with a resin forming the second resin forming portion 2. Thus, a double molding structure is achieved which has a heat dissipation function capable of releasing heat, generated from the mounted optical sensor element 5, to outside through an adhesive 7 via the die pad portion 8.

Fourth Embodiment

Figure 4:
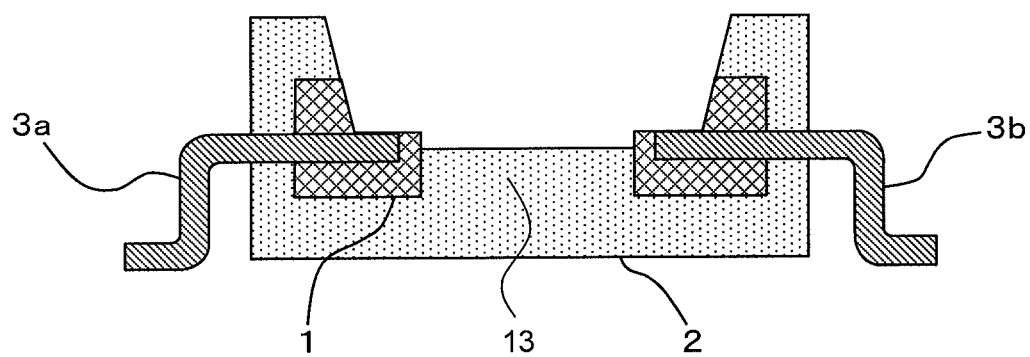
FIG. 4 is a sectional view schematically illustrating a configuration of an optical sensor device according to a fourth embodiment of the present invention.

FIG. 4 is a sectional view of an optical sensor device 11 according to a fourth embodiment of the present invention. In a first resin molded portion 1, the peripheries of leads 3*a* and 3*b*, excluding a portion in which a lead surface to be used as a wire bonding portion is exposed, are molded with the first resin molded portion 1, and the first resin molded portion 1 forms the periphery of a bottom portion. An element mounting portion 13 to be a center of the bottom portion on which an optical sensor element 5 is to be mounted has a double molding structure provided by molding with a second resin molded portion 2. In the case of this structure, compared to the first embodiment, the optical sensor element 5 to be mounted on the bottom portion in a cavity is more liable to receive influence by the optical characteristics of the resin of the second resin molded portion 2.

Fifth Embodiment

Figure 5:
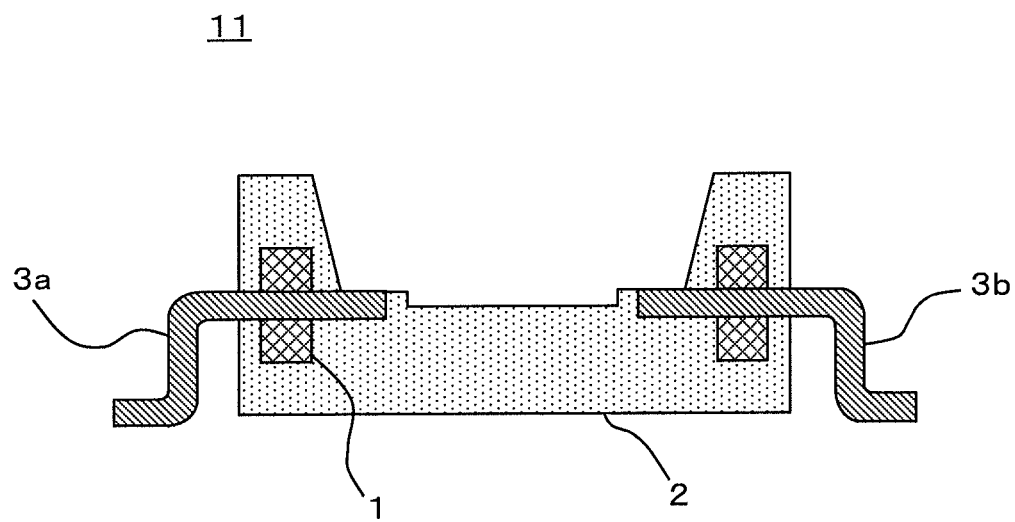
FIG. 5 is a sectional view schematically illustrating a configuration of an optical sensor device according to a fifth embodiment of the present invention.

FIG. 5 is a sectional view of an optical sensor device 11 according to a fifth embodiment of the present invention. A double molding structure is achieved in which a first resin molded portion 1 is completely buried in a second resin molded portion 2 without being exposed from a bottom portion of a cavity. In the case of this structure, the optical characteristics of a resin to be used for the second resin molded portion 2 influence an optical sensor element 5 to be mounted on the bottom portion of the cavity, and the purpose of providing the first resin molded portion 1 is to hold leads 3*a* and 3*b*, increase the removal preventing force of the leads 3*a* and 3*b*, and achieve contact fitting.

Sixth Embodiment

Figure 6:
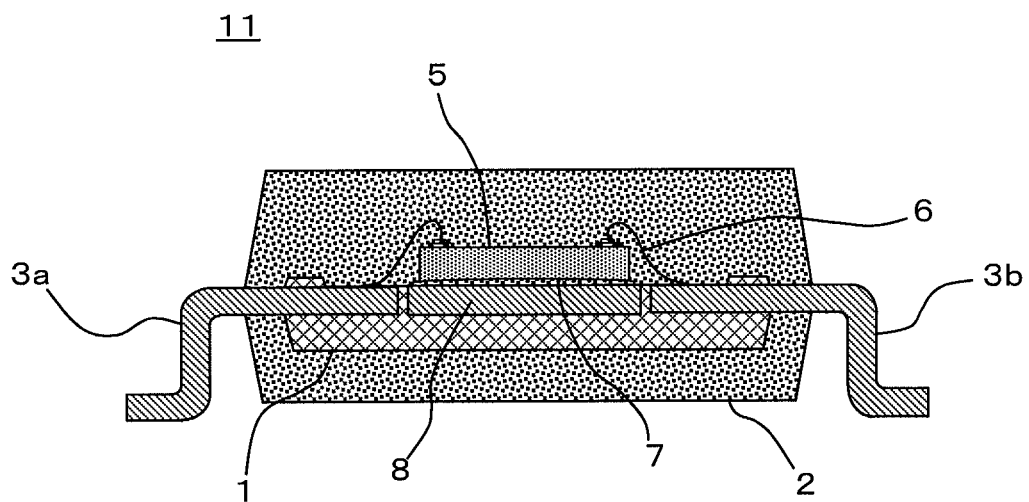
FIG. 6 is a sectional view schematically illustrating a configuration of an optical sensor device according to a sixth embodiment of the present invention.

FIG. 6 is a sectional view of an optical sensor device 11 according to a sixth embodiment of the present invention. A cavity is not formed in a double molding structure including a first resin molded portion 1 and a second resin molded portion 2. The first resin molded portion 1 has a structure in which the peripheries of leads 3*a* and 3*b*, excluding a portion in which a lead surface to be used as a wire bonding portion is exposed, and the periphery of a die pad portion 8 formed of a metal frame are molded with a resin so as to be integrated. In this case, the periphery of the die pad portion 8, excluding a surface side on which an optical sensor element 5 is to be mounted with an adhesive 7, is subjected to contact fitting molding through use of a resin.

The periphery of the die pad portion 8 formed of a metal frame is connected to a suspension lead. In the die pad portion 8 immediately after the first resin molded portion 1 is molded, the periphery of the die pad portion 8 is still connected to the suspension lead so as to be held by the first resin molded portion 1. After the suspension lead is cut off, a cut surface of the suspension lead is exposed from a side surface of the first resin molded portion 1, and the first resin molded portion 1 having the cut surface of the suspension lead exposed therefrom is subjected to contact fitting molding with a second resin molded portion 2, with the result that a package is obtained in which the cut surface of the suspension lead is not exposed from a resin molded surface. Therefore, even when the package has a structure in which the die pad portion 8 on which the optical sensor element 5 is to be mounted is formed of a metal frame having the suspension lead, the cut surface of the suspension lead is not exposed from the resin molded surface, and there is no interface between the resin and the lead on the die pad portion 8 on which the optical sensor element 5 is to be mounted. Thus, an optical sensor device having high airtightness can be obtained in which the die pad portion 8 is formed as an element mounting portion having high airtightness without an entrance path for water and the like, and the leads 3*a* and 3*b* and the die pad portion 8 are strongly held and molded with the resin so as to have high adhesion.

In this case, the die pad portion 8 may not have a structure using a metal frame and may be provided by molding with the first resin molded portion 1. Further, the second resin molded portion 2 has a contact fitting molding structure so as to cover the entire periphery of the first resin molded portion 1 without forming openings. By using a resin containing a filler of the finely pulverized glass substrate 4 having a filter function or a resin containing a dye or a pigment having a filter function as the resin for the second resin molded portion 2, an optical sensor device having a filter function as well as the effect of the double molding structure can be obtained. Further, the second resin molded portion 2 may be molded with a permeable resin not containing the above-mentioned filler.

Seventh Embodiment

Figure 7:
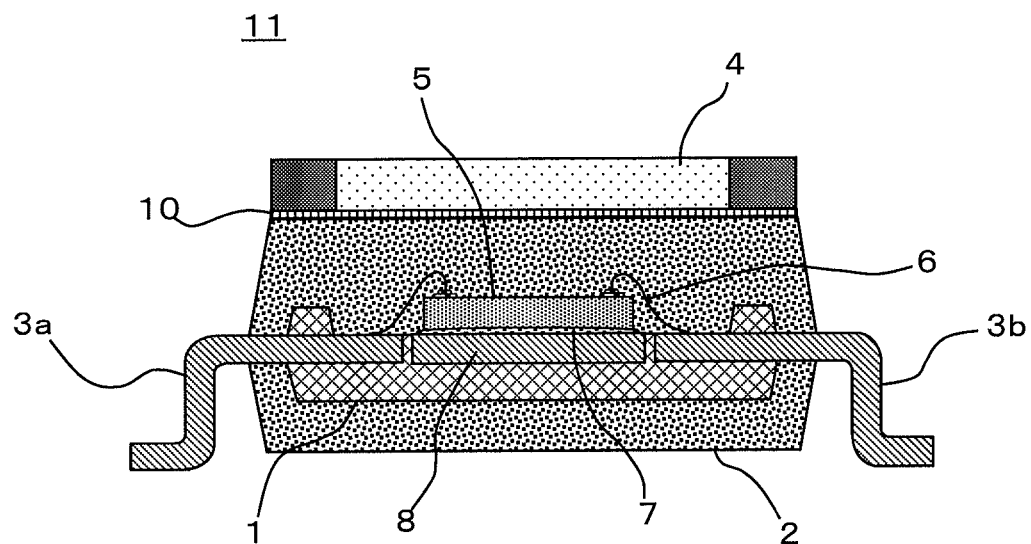
FIG. 7 is a sectional view schematically illustrating a configuration of an optical sensor device according to a seventh embodiment of the present invention.

FIG. 7 is a sectional view of an optical sensor device 11 according to a seventh embodiment of the present invention. The optical sensor device 11 has a structure in which a glass substrate 4 having a filter function is provided on an upper surface of a translucent second resin molded portion 2 forming an outer periphery of a double molding structure not having a cavity. Further, the thickness of a resin molded on an upper surface side of a lead in the first resin molded portion 1 is set so as to be substantially the same as that of an optical sensor element 5 after being mounted on a die pad portion 8. Thus, light can enter the optical sensor element 5 from a front side while a light component thereof having a specified wavelength is transmitted and absorbed by a glass substrate 4 having a filter function, and light that enters the optical sensor element 5 from a back surface and a side surface thereof can be blocked by the first resin molded portion 1.

Eighth Embodiment

Figure 8:
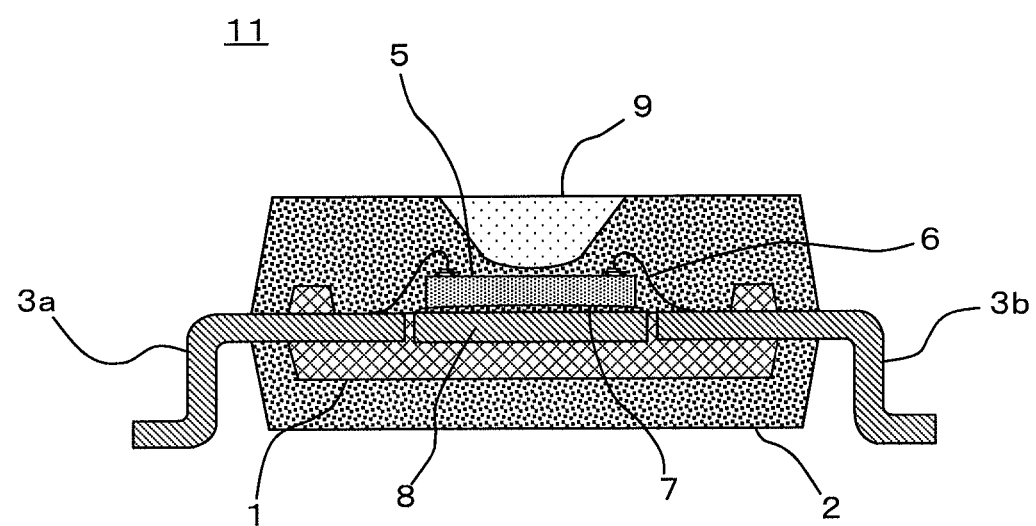
FIG. 8 is a sectional view schematically illustrating a configuration of an optical sensor device according to an eighth embodiment of the present invention.

FIG. 8 is a sectional view of an optical sensor device 11 according to an eighth embodiment of the present invention. The optical sensor device 11 has a molding structure in which a concave portion is formed in advance in an upper surface portion of a second resin molded portion 2, which corresponds to a front surface direction of an optical sensor element 5, in a double molding structure not having a cavity. A resin 9 containing a filler of a finely pulverized glass substrate 4 having a filter function or a resin 9 containing a dye or a pigment having a filter function is applied to the concave portion so as to obtain a filter function with respect to light that enters the optical sensor element 5. As the resin to be used for the second resin molded portion 2, a resin having translucency or a filter function is used. As the resin to be used for the first resin molded portion 1, a resin having light-blocking property is used. The thickness of a part of the second resin molded portion 2 between an upper surface of the optical sensor element 5 and a bottom of the concave portion formed in the second resin molded portion 2 is small, and hence an effect that the optical sensor element 5 is less liable to be influenced by the optical characteristics of the resin of the second resin molded portion 2 can be obtained. Further, the bottom of the concave portion is provided with a curvature, and hence an effect that a sensor portion provided on the upper surface of the optical sensor element 5 can receive a condensed light flux can be obtained.

Ninth Embodiment

Figure 9:
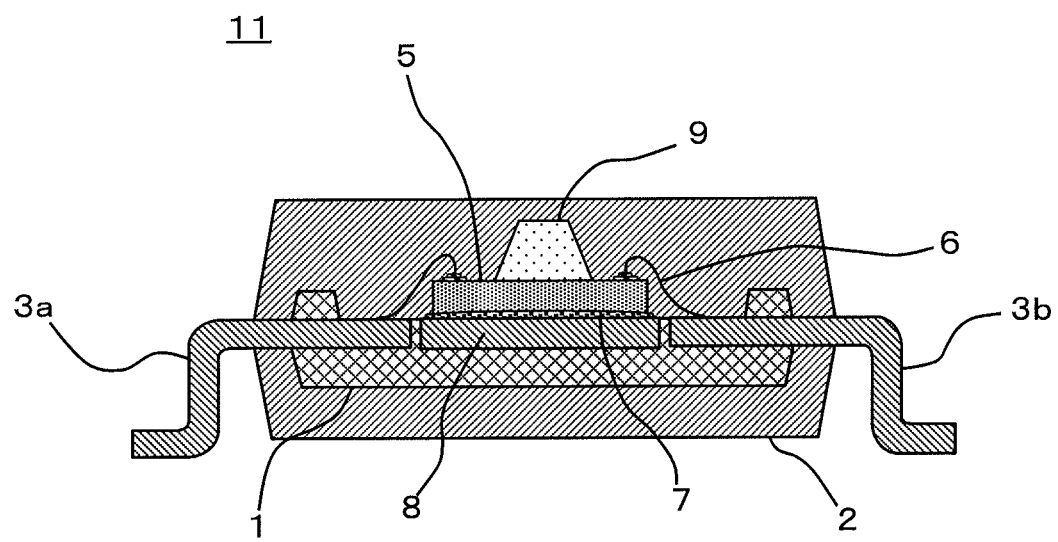
FIG. 9 is a sectional view schematically illustrating a configuration of an optical sensor device according to a ninth embodiment of the present invention.

FIG. 9 is a sectional view of an optical sensor device 11 according to a ninth embodiment of the present invention. The optical sensor device 11 has a structure in which a resin 9 containing a filler of finely pulverized glass having a filter function or a resin 9 containing a dye or a pigment having a filter function is applied to an upper surface of an optical sensor element 5 so as to have a predetermined thickness and width in a double molding structure not having a cavity. Further, the resin 9 containing a filler of finely pulverized glass having a filter function or the resin 9 containing a dye or a pigment having a filter function is formed into a tapered shape in which a side thereof in contact with the optical sensor element 5 is wider than the other side. Thus, the periphery of a portion to which the resin 9 having a filter function is applied is covered with the second resin molded portion 2, and the contact fitting property between the resin 9 and the second resin molded portion 2 is enhanced. Therefore, the optical sensor element 5 is not directly exposed to water and heat from outside, and hence an effect that the reliability of the resin 9 having a filter function hardly changes so as to be maintained for a long period of time can be obtained.

Tenth Embodiment

Figure 10:
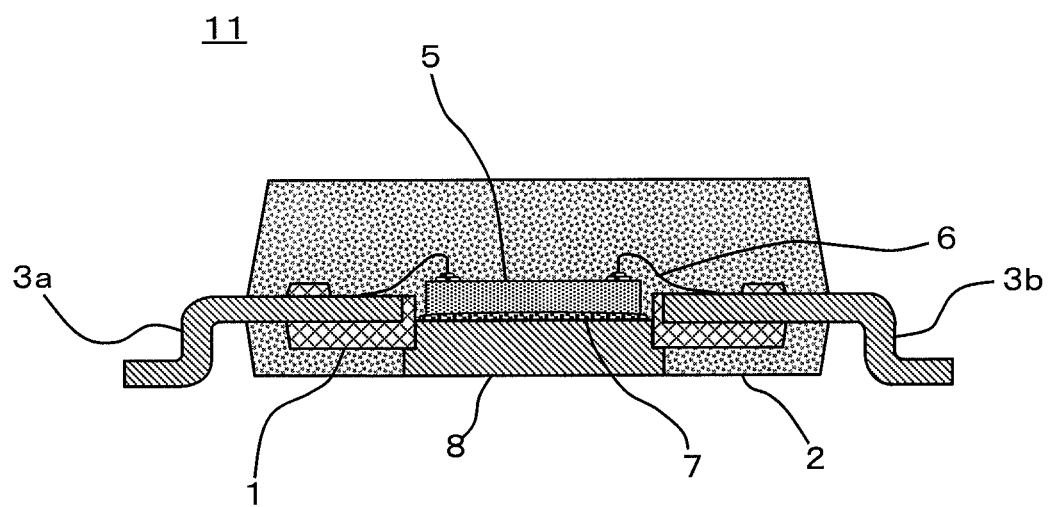
FIG. 10 is a sectional view schematically illustrating a configuration of an optical sensor device according to a tenth embodiment of the present invention.
Figure 11:
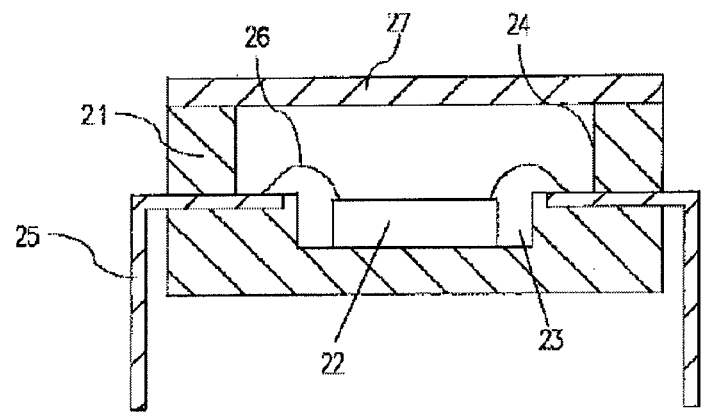
FIG. 11 is a sectional view schematically illustrating a configuration of a related-art optical sensor device.
Figure 12:
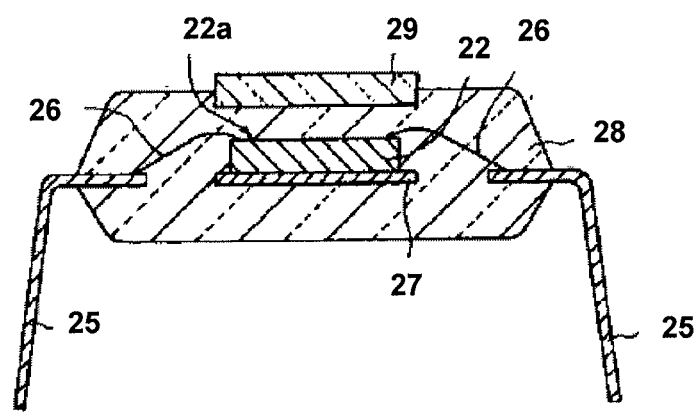
FIG. 12 is a sectional view schematically illustrating a configuration of a related-art optical sensor device.

FIG. 10 is a sectional view of an optical sensor device 11 according to a tenth embodiment of the present invention. The optical sensor device 11 has a structure in which a die pad portion 8 is exposed from a second resin molded portion 2 in a double molding structure not having a cavity. The die pad portion 8 is formed of a metal frame so as to have a heat dissipation structure exposed from a surface of the second resin molded portion 2. A first resin molded portion 1 has a molding structure in which the entire peripheries of the die pad portion 8 and the leads 3a and 3b are integrated by contact fitting molding, with the thickness of the first resin molded portion 1 on a side surface of the die pad portion 8 being about a half that of the die pad portion 8. The periphery of the die pad portion 8, in which a side surface thereof is not molded with the first resin molded portion 1, is subjected to contact fitting molding with the second resin molded portion 2, and a back surface of the die pad portion 8 on which the optical sensor element 5 is not to be mounted is exposed to outside. Thus, the following effect can be expected. Specifically, even in the case where the die pad portion 8 having a heat dissipation structure is provided, the optical sensor device 11 has high airtightness in the same way as in the interface between the external lead terminal and the second resin molded portion 2. Further, the high holding force and the high removal preventing force are achieved in the leads 3a and 3b and the die pad portion 8.

In a miniaturized resin molded package having a lead, in which lead terminals are thinned and the number thereof is increased, a resin molded portion is allowed to have a double molding structure. The double molding structure includes a first molding portion in which the peripheries of a wire bonding portion of a lead and a die pad portion are integrated, and a second molding portion in which the periphery of the first molding portion is molded so as to form an outer shape of the package. Those molding portions are subjected to contact fitting molding. Thus, an optical sensor device having a highly reliable hollow structure package can be provided in which the removal preventing force of the lead held by the resin is increased, the adhesion between the lead and die pad portion and the resin is enhanced, and the airtightness is significantly improved.

Further, this structure can also be used for a package having a closed sealing and molding structure not having a cavity. Thus, an optical sensor device having a highly reliable package can be provided in which the adhesion between the lead and die pad portion and the resin is enhanced, the holding force and the removal preventing force of the lead are increased, and the airtightness is significantly improved. Through use of the package structure according to one embodiment of the present invention not only for an optical sensor device but also for other devices, it is possible to contribute to provision of equipment having an optical sensor device mounted thereon and the like in consideration of the use for household electrical appliances, the use in vehicles or outdoor use under a severe environment, or the use for the application in which an element having characteristics liable to change sensitively depending on the ambient environment is mounted.

What is claimed is:

1. An optical sensor device, comprising:
a die pad portion;
an optical sensor element disposed on the die pad portion;
a plurality of leads formed separately around the die pad portion;
a first resin molding portion holding a periphery of the die pad portion and first peripheries of the plurality of leads excluding a portion in which a surface of each of the plurality of leads used as a wire bonding portion is exposed after integration by contact fitting molding using a first resin;
a second resin molding portion covering an entire periphery of the first resin molding portion and second peripheries of the plurality of leads by contact fitting molding using a second resin, the second resin molding portion having one of a resin with transparency, a resin containing a filler of finely pulverized glass having a first filter function, and a resin containing a dye or a pigment having a second filter function; and a suspension lead connected to the die pad portion, the suspension lead having a cut surface exposed from the first resin molding portion, but not exposed from the second resin molding portion.

2. An optical sensor according to claim 1, further comprising a glass substrate having a filter function disposed on an upper surface of the second resin molding portion.

3. An optical sensor device according to claim 1, further comprising a concave portion disposed in an upper surface portion of the second resin molding portion and in front of the optical sensor element, the inside of the concave portion being filled with one of a resin containing a filler of finely pulverized glass having a third filter function and a resin containing a dye or a pigment having a fourth filter function.

4. An optical sensor device according to claim 1, further comprising a stucture having a tapered shape in which a side thereof in contact with the optical sensor element is wider than another side, the structure being formed from one of a resin containing a filler of finely pulverized glass having a fifth filter function and a resin containing a dye or a pigment having a sixth filter function, and the structure being covered with the second resin molding portion.

5. An optical sensor device according to claim 1, wherein the die pad portion has a lower surface opposite to an upper surface on which the optical sensor element is disposed, the lower surface being exposed from the second resin molding portion.

6. An optical sensor device, comprising:
a die pad portion;
an optical sensor element disposed on the die pad portion;
a plurality of leads formed separately around the die pad portion;
a first resin molding portion holding a periphery of the die pad portion and first peripheries of the plurality of leads excluding a portion in which a surface of each of the plurality of leads used as a wire bonding portion is exposed after integration by contact fitting molding using a first resin; and a second resin molding portion covering an entire periphery of the first resin molding portion, at least a part of an upper surface of the optical sensor element, and second peripheries of the plurality of leads by contact fitting molding using a second resin, the second resin molding portion having one of a resin with transparency, a resin containing a filler of finely pulverized glass having a first filter function, and a resin containing a dye or a pigment having a second filter function.

7. An optical sensor device according to claim 6, further comprising a glass substrate having a filter function disposed on an upper surface of the second resin molding portion.

8. An optical sensor device according to claim 6, further comprising a concave portion disposed in an upper surface portion of the second resin molding portion and in front of the optical sensor element, the inside of the concave portion being filled with one of a resin containing a filler of finely pulverized glass having a third filter function and a resin containing a dye or a pigment having a fourth filter function being filled.

9. An optical sensor device according to claim 6, further comprising a stucture having a tapered shape in which a side thereof in contact with the optical sensor element is wider than another side, the structure being formed from one of a resin containing a filler of finely pulverized glass having a fifth filter function and a resin containing a dye or a pigment having a sixth filter function, and the structure being covered with the second resin molding portion.

10. An optical sensor device according to claim 6, wherein the die pad portion has a lower surface opposite to an upper surface on which the optical sensor element is disposed, the lower surface being exposed from the second resin molding portion.

11. An optical sensor device according to claim 6, wherein the second resin molding portion has one of a resin containing a filler of finely pulverized glass having a first filter function, and a resin containing a dye or pigment having a second filter function.

* * * * *